(12) United States Patent
Matsuzawa et al.

(10) Patent No.: US 8,432,645 B2
(45) Date of Patent: Apr. 30, 2013

(54) MAGNETO-RESISTIVE EFFECT ELEMENT, MAGNETIC HEAD, MAGNETIC HEAD SLIDER, HEAD GIMBAL ASSEMBLY AND HARD DISK DRIVE APPARATUS

(75) Inventors: Hironobu Matsuzawa, Tokyo (JP); Yoshihiro Tsuchiya, Tokyo (JP); Hayato Koike, Tokyo (JP); Tsutomu Chou, Tokyo (JP)

(73) Assignee: TDK Corporation, Tokyo (JP)

( * ) Notice: Subject to any disclaimer, the term of this patent is extended or adjusted under 35 U.S.C. 154(b) by 285 days.

(21) Appl. No.: 13/017,200

(22) Filed: Jan. 31, 2011

(65) Prior Publication Data
US 2012/0196153 A1 Aug. 2, 2012

(51) Int. Cl.
*G11B 5/39* (2006.01)
(52) U.S. Cl.
USPC .................................................. 360/324.1
(58) Field of Classification Search ............... 360/324.1
See application file for complete search history.

(56) References Cited

U.S. PATENT DOCUMENTS

| 7,603,763 B2 * | 10/2009 | Djayaprawira et al. ..... 29/603.13 |
| 7,826,180 B2 * | 11/2010 | Tsuchiya et al. ............ 360/324.1 |
| 7,920,362 B2 * | 4/2011 | Hara et al. .................. 360/324.1 |
| 8,031,444 B2 * | 10/2011 | Chou et al. .................. 360/324.1 |
| 8,345,390 B2 * | 1/2013 | Tsuchiya et al. ............ 360/324.2 |
| 2004/0264068 A1 | 12/2004 | Kanaya et al. |
| 2007/0127165 A1 | 6/2007 | Kanaya et al. |
| 2009/0059443 A1 | 3/2009 | Tsuchiya et al. |
| 2009/0067099 A1 | 3/2009 | Tsuchiya et al. |
| 2009/0086383 A1 | 4/2009 | Hara et al. |

* cited by examiner

*Primary Examiner* — Mark Blouin
(74) *Attorney, Agent, or Firm* — Posz Law Group, PLC

(57) ABSTRACT

An MR element includes a stack, being a pillar or trapezoidal stack, including first and second magnetic layers in which a relative angle formed by magnetization directions changes according to an external magnetic field, and a spacer layer that is positioned between the first magnetic layer and the second magnetic layer, and that is provided with a main spacer layer that is composed of gallium oxide, zinc oxide or magnesium oxide as a primary component, wherein, one part of side surfaces of the stack forms a part of an air bearing surface; and a cover layer that covers at least another part of the side surfaces of the stack and that is composed of gallium oxide as a primary component.

20 Claims, 7 Drawing Sheets

MAGNETO-RESISTIVE EFFECT ELEMENT, MAGNETIC HEAD, MAGNETIC HEAD SLIDER, HEAD GIMBAL ASSEMBLY AND HARD DISK DRIVE APPARATUS

BACKGROUND OF THE INVENTION

1. Field of the Invention

The present invention relates to a magneto-resistive effect (MR) element, magnetic head, magnetic head slider, head gimbal assembly and hard disk drive apparatus. In particular, the present invention relates to a configuration of a spacer layer and a cover layer of a stack.

2. Description of the Related Art

Reproducing heads with high sensitivity and high output are in demand in conjunction with condensing of high recording density in hard disk drives (HDD). As an example of this type of reproducing head, a spin valve head has been developed. A spin valve head includes a nonmagnetic metal layer and a pair of ferromagnetic layers positioned on both sides of the nonmagnetic metal layer in a manner of contacting the nonmagnetic metal layer. The magnetization direction of one side of the ferromagnetic layers is pinned in one direction (hereinafter, this type of layer is referred to as a magnetization pinned layer), and the magnetization direction of the other side of the ferromagnetic layers freely rotates in response to an external magnetic field (hereinafter, this type of layer is referred to as a magnetization free layer). When an external magnetic field is applied, the relative angle of the spins between the magnetization pinned layer and the magnetization free layer changes so that magneto-resistive change is realized. Typically, the magnetization direction of the magnetization pinned layer is pinned by utilizing the exchange coupling force of an anti-ferromagnetic layer.

On the other hand, in order to realize further condensing of high recording density, a reduction of a read gap (a space between upper and lower shield layers) is required. However, when the read gap is reduced to about 20 nm, placing an anti-ferromagnetic layer within the read gap becomes difficult. Therefore, a configuration has been developed in which a pair of magnetization free layers is arranged on both sides of a spacer layer. According to this configuration, reduction of the read gap is easily realized because an anti-ferromagnetic layer is unnecessary.

With either configuration, the spacer layer is a necessary component to realize magneto-resistive change, and promising spacer layer materials have been developed to achieve a large magneto-resistive ratio (hereinafter referred to as the MR ratio). On the other hand, the layers such as the spacer layer, magnetization pinned layer, magnetization free layer, etc. are processed into extremely fine shapes to accurately detect a magnetic field emitted from a specified bit of a magnetic recording medium. Specifically, after film formation, these layers are processed into a pillar or trapezoidal stack, and a bias magnetic field application layer that applies a bias magnetic field to the periphery of the stack is arranged. In particular, since the bias magnetic field application layer is conductive, the periphery of the stack is covered by an insulative cover layer to prevent a sense current from leaking in the bias magnetic field application layer. As described above, the cover layer is disposed for a purpose of maintaining an insulation property on side surfaces of the stack, and conventionally, $Al_2O_3$ has been typically utilized. However, the cover layer directly contacts the spacer layer as well as the magnetization pinned layer and the magnetization free layer, and the effects on the MR ratio, etc. are noted. Therefore, various technologies regarding combinations of the spacer layer and the cover layer are disclosed.

U.S. Patent Application Publication No. 2009/0059443 discloses a spacer layer where a semiconductor layer composed of either ZnO, $In_2O_3$ or $SnO_2$ is sandwiched by metal layers composed of Cu, Au, etc. The cover layer is configured with two layers. An inner layer contacting the stack is composed of $HfO_2$, MgO, $ZrO_2$, $Ta_2O_5$, $TiO_2$, etc; and an outer layer is formed with an insulating layer composed of $Al_2O_3$, $SiO_2$, etc.

U.S. Patent Application Publication No. 2009/0067099 discloses materials for the spacer layer that are similar to U.S. Patent Application Publication No. 2009/0059443, and discloses a cover layer with a three layer configuration also. An innermost layer of the cover layer is formed of a material in common with the spacer layer, and, for example, ZnO is disclosed. A middle layer is disposed for a purpose of forming a Schottky barrier at an interface with the innermost layer, and is formed of Os, Ir, Pt, etc. An outermost layer is formed with an insulating layer made of $Al_2O_3$, $SiO_2$, etc.

It is an object of the present invention to provide an MR element that can realize a large MR ratio by further improving a configuration of a spacer layer and a cover layer.

SUMMARY OF THE INVENTION

A magneto-resistive effect element (MR element) with respect to one embodiment of the present invention includes: a stack, being a pillar or trapezoidal stack, including first and second magnetic layers in which a relative angle formed by magnetization directions changes according to an external magnetic field, and a spacer layer that is positioned between the first magnetic layer and the second magnetic layer, and that is provided with a main spacer layer that is composed of gallium oxide, zinc oxide or magnesium oxide as a primary component, wherein, parts of side surfaces of the stack form parts of an air bearing surface; and a cover layer that covers at least another part of the side surfaces of the stack and that is composed of gallium oxide as a primary component.

Since the spacer layer including the main spacer layer composed of gallium oxide, zinc oxide or magnesium oxide as a primary component has a higher resistance than the conventional spacer layer formed with a metal layer such as copper, etc., a large MR ratio can be obtained. Specifically, gallium oxide normally exists in an amorphous state when gallium oxide is in a thin film state; however, there are advantages in that a wide band gap can be maintained even in the amorphous state and in that lattice matching (matching of lattice constants of two adjacent materials) between the spacer layer and an adjacent ferromagnetic layer is unnecessary. By combining the stack including the above-described main spacer layer with the cover layer composed of gallium oxide as the primary component, the MR ratio is highly improved.

An MR element with respect to another embodiment of the present invention includes: a stack, being a pillar or trapezoidal stack, including first and second magnetic layers in which a relative angle formed by magnetization directions changes according to an external magnetic field, and a spacer layer that is positioned between the first magnetic layer and the second magnetic layer, and that is provided with a main spacer layer that is composed of gallium oxide as a primary component, wherein parts of side surfaces of the stack form parts of an air bearing surface; and a cover layer that covers at least another part of the side surfaces of the stack and that is composed of magnesium oxide as a primary component.

A method for manufacturing the MR element of another embodiment of the present invention includes forming a multilayer film that includes the first and second magnetic layers in which a relative angle formed by magnetization directions changes according to an external magnetic field and that includes the main spacer layer positioned between the first magnetic layer and the second magnetic layer and composed of gallium oxide, zinc oxide or magnesium oxide as a primary component, forming the multilayer film into a pillar or trapezoidal stack, and covering side surfaces of the stack with a cover layer composed of gallium oxide as a primary component.

The following are preferred conditions: introducing either inert gas or inert gas and oxygen gas into a film forming chamber when forming the main spacer layer; introducing inert gas and oxygen gas into the film forming chamber when forming the cover layer, and a ratio of flow rate of oxygen gas with respect to total flow rate of gas introduced when forming the cover layer being larger than a ratio of flow rate of oxygen gas with respect to total flow rate of gas introduced when forming the spacer layer.

According to the above-described preferable manufacturing method, in one example, oxygen gas is introduced when the cover layer is formed, and oxygen gas is not introduced when forming the main spacer layer. In another example, oxygen gas is introduced when both forming the cover layer and forming the main spacer layer; however, a ratio of a flow rate of oxygen gas when forming the cover layer is larger than when forming the main spacer layer. The inventor of the present invention discovered that an even larger MR ratio is obtained by controlling the presence or absence of introducing oxygen gas as described above or adjusting the amount of oxygen gas introduced.

The above description, as well as other objects, features, and advantages of the present specification will be evident by the detailed description that follows below with reference to attached drawings illustrating the present specification.

DETAILED DESCRIPTION OF THE INVENTION

Descriptions regarding an MR element that relates to embodiments of the present invention and embodiments of a thin film magnetic head utilizing the MR element are given utilizing the drawings.

First Embodiment

Figure 1:
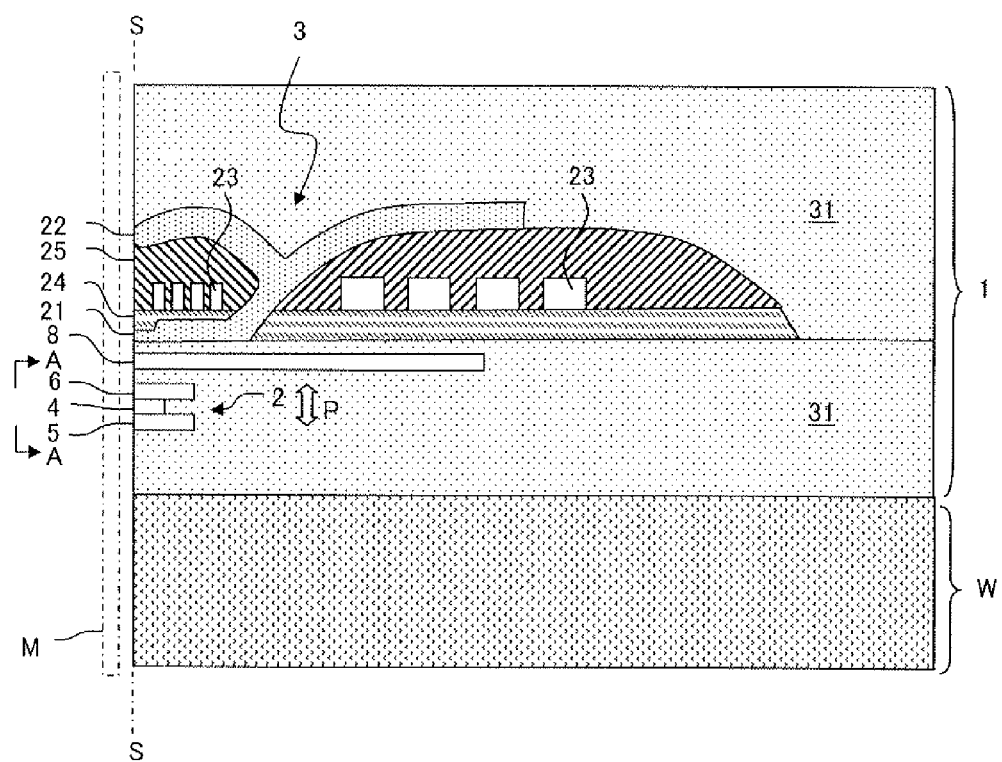
FIG. 1 is a main part cross-sectional view of a thin film magnetic head that is common to each of embodiments.
Figure 2A:
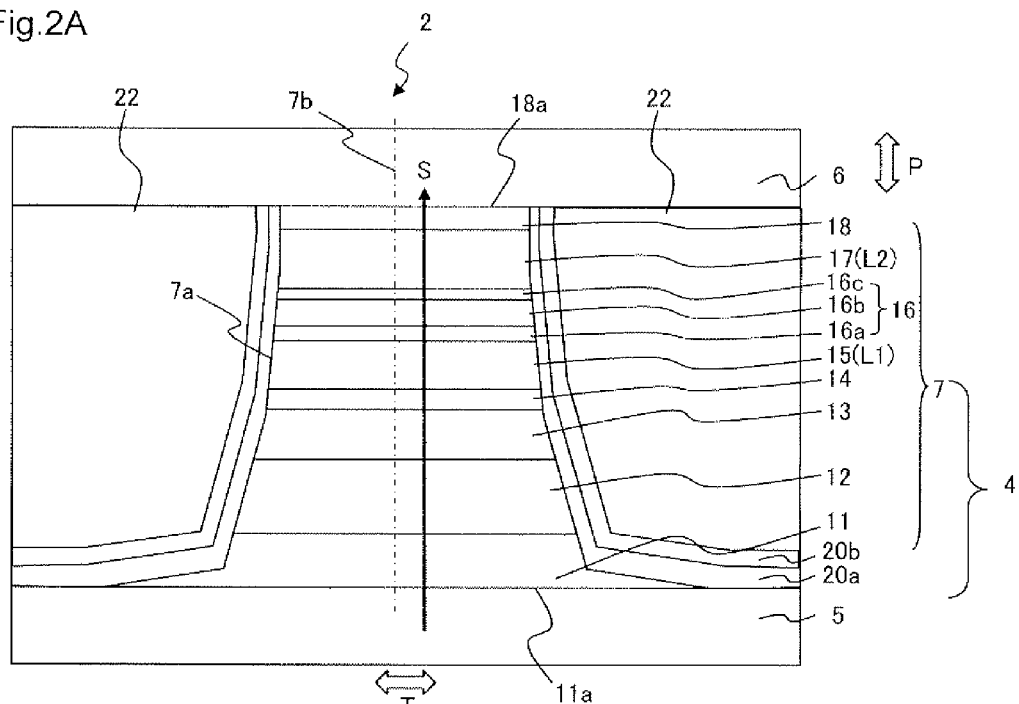
FIG. 2A is a side view of an MR element that relates to a first embodiment, as viewed from the A-A direction of FIG. 1, i.e., an air bearing surface.
Figure 2B:
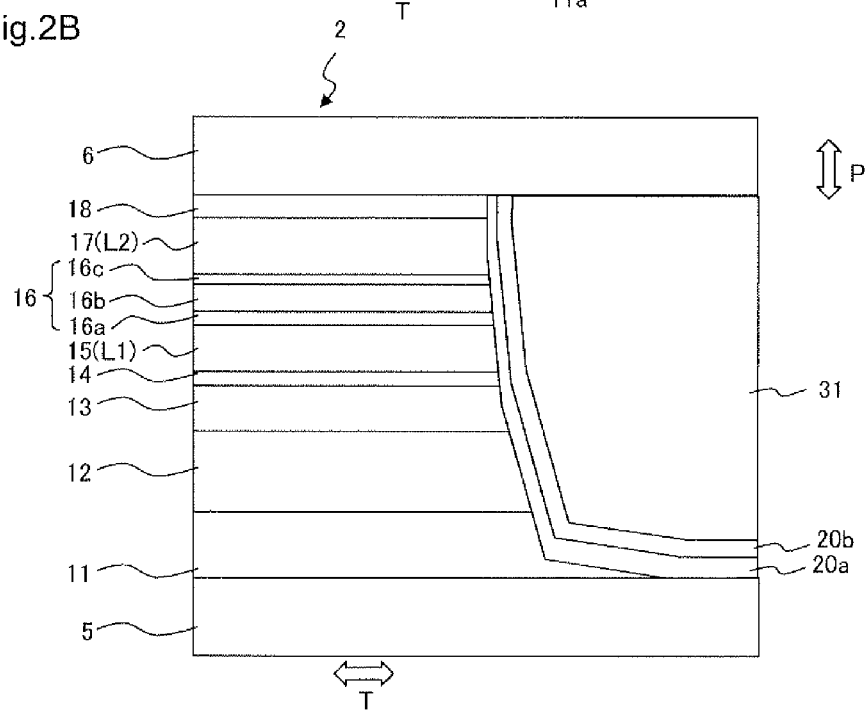
FIG. 2B is a side view of the MR element that relates to the first embodiment, as viewed from the same direction as FIG. 1.

FIG. 1 illustrates a main part cross-sectional view of a thin film magnetic head 1 that relates to a first embodiment. The thin film magnetic head 1 is formed on a substrate W, and includes a reproducing head 2 and a recording head 3. FIG. 2A is a side view of the reproducing head 2 as viewed from the A-A direction of FIG. 1 and illustrates the layer configuration of the reproducing head 2 on the air bearing surface S. FIG. 2B is a side view of the reproducing head 2 as viewed from the same direction as FIG. 1. The air bearing surface S is a surface of the thin film magnetic head 1 that faces a recording medium M. First, a description will be given regarding the configuration of the reproducing head 2 with reference to FIGS. 2A and 2B.

The reproducing head 2 includes a spin valve type MR element 4, upper and lower shield layers 6 and 5 disposed so as to sandwich the MR element 4 in a film surface orthogonal direction (lamination direction) P, and bias magnetic field application layers 22 disposed on both sides in the track width direction T of the MR element 4 (sheet surface orthogonal direction in FIG. 1). The tip end part of the MR element 4, as illustrated in FIG. 1, is arranged on the air bearing surface S.

The MR element 4 includes a pillar or trapezoidal stack 7 that includes at least first and second magnetic layers L1 and L2 in which a relative angle formed by magnetization directions changes according to an external magnetic field and a spacer layer 16. Parts of side surfaces 7a of the stack 7 form parts of the air bearing surface S. The side surfaces 7a of the stack 7 are surfaces of the stack 7 excluding both side end surfaces (a surface 11a of an under layer 11 that faces the lower shield layer 5, and a surface 18a of a protective layer 18 that faces an upper shield layer 6) of the stack 7 parallel to each of the layers forming the stack 7. The stack 7 has a nearly rectangular cross-sectional-shape, as viewed along a cross-section parallel to the layers forming the stack 7, and its one side forms a part of the air bearing surface S. The cross-section of the stack 7 is generally in a rectangular shape; however, the cross-section is not limited to the rectangular shape. On the surface of the stack 7 on an air bearing surface S side, a protective layer (not illustrated) may be formed. With such a structure, to be exact, a surface of the protective layer is the air bearing surface S; however, the present specification defines the surface of the stack 7 as a part of the air bearing surface S.

The stack 7 may have a shape where an upper shield layer 6 side is tapered and a lower shield layer 5 side is widened on an arbitrary cross-section orthogonal to the above-described cross-section. Note, excluding the side surfaces 7a forming a part of the air bearing surface S, the side surfaces 7a of the stack 7 may be oblique to an axis 7b of the stack 7. Or, the whole portions of the side surfaces 7a of the stack 7 may be orthogonal to the film surfaces of layers forming the stack 7.

The stack 7 is arranged so that a sense current S flows in a film surface orthogonal direction P by voltage applied between the upper shield layer 6 and the lower shield layer 5. A magnetic field from the recording medium M positioned facing the MR element 4 changes by the rotation of the recording medium M. The magnetic field change is detected as an electrical resistance change of a sense current S based on magneto-resistive effect. The MR element 4 reads magnetic information written in the recording medium M utilizing this principle.

Table 1 illustrates one example of a layer configuration of the stack 7. Table 1 describes the lower shield layer 5 through the upper shield layer 6 from bottom to up in the lamination order.

TABLE 1

| Layer Configuration | | | Material | Film Thickness (nm) |
|---|---|---|---|---|
| Upper Shield Layer 6 | | | NiFe | 2000 |
| Stack 7 | Protective Layer 18 | | Ru | 2.0 |
| | Magnetization Free layer 17 (Second Magnetic Layer L2) | | CoFe | 4.0 |
| | Spacer Layer 16 | Second Nonmagnetic Layer 16c | Zn (or Cu) | 0.4 |
| | | Main Spacer Layer 16b | GaOx or ZnO | GaOx 0.8 ZnO 1.6 |
| | | First Nonmagnetic Layer 16a | Cu | 0.6 |
| | Inner Magnetization Pinned Layer 15 (First Magnetic Layer L1) | | CoFe | 3.5 |
| | Exchange Coupling Transmitting Layer 14 | | Ru | 0.8 |
| | Outer Magnetization Pinned Layer 13 | | CoFe | 3.0 |
| | Anti-Ferromagnetic Layer 12 | | IrMn | 5.0 |
| | Under Layer 11 | | NiCr | 4.0 |
| Lower Shield Layer 5 | | | NiFe | 2000 |

The stack 7 has a layer configuration in which the following are laminated on the lower shield layer 5 formed with an NiFe layer in this order: the under layer 11, an anti-ferromagnetic layer 12, an outer magnetization pinned layer 13, an exchange coupling transmitting layer 14, an inner magnetization pinned layer 15 (first magnetic layer L1), a spacer layer 16, a magnetization free layer 17 (second magnetic layer L2), and a protective layer 18. The protective layer 18 is covered by the upper shield layer 6 formed with a NiFe layer.

The under layer 11 is disposed in order to obtain a favorable exchange coupling between the outer magnetization pinned layer 13 and the anti-ferromagnetic layer 12 laminated thereon. The outer magnetization pinned layer 13 is exchange coupled with the anti-ferromagnetic layer 12 composed of IrMn. The outer magnetization pinned layer 13 is exchange coupled with the inner magnetization pinned layer 15 with the exchange coupling transmitting layer 14 composed of Ru therebetween. As a result, the magnetization direction of the inner magnetization pinned layer 15 is firmly pinned. It is preferable that the inner magnetization pinned layer 15 is magnetized in a direction orthogonal to the air bearing surface S within the film plane. The magnetization directions of the inner magnetization pinned layer 15 and the outer magnetization pinned layer 13 are pinned in mutually antiparallel orientations, and thus the overall magnetization of these combined areas may be suppressed. The magnetization free layer 17 in which the magnetization direction changes according to an external magnetic field is disposed on the inner magnetization pinned layer 15, sandwiching the spacer layer 16 therebetween. The protective layer 18 is disposed to prevent the deterioration of each laminated layer. The outer and inner magnetization pinned layers 13 and 15, together with the magnetization free layer 17, are typically composed of CoFe and may contain Ni.

The bias magnetic field application layers 22 are formed on both sides in the track width direction T of the stack 7 with a cover layer 20a and an insulating layer 20b therebetween. The bias magnetic field application layers 22 are a magnetic domain control film that changes the magnetization free layer 17 to a single magnetic domain, and applies a bias magnetic field to the magnetization free layer 17 in the track width direction T. The bias magnetic field application layers 22 are formed of CoPt, CoCrPt, or the like.

The sense current S flows in the stack 7 in the film surface orthogonal direction P. The sense current S is supplied from the upper and lower shield layers 6 and 5 which also function as electrodes. The magnetization direction of the magnetization free layer 17 is controlled in the track width direction T, i.e., in the direction orthogonal to the magnetization direction of the inner magnetization pinned layer 15, by the bias magnetic field from the bias magnetic field application layers 22 when an external magnetic field is not applied. When the external magnetic field from the recording medium M is applied to the magnetization free layer 17, the magnetization direction of the magnetization free layer 17 rotates by a predefined angle in the predefined direction within the film plane according to the direction and strength of the external magnetic field. The magnetization direction of the magnetization free layer 17 forms a relative angle with the magnetization direction of the inner magnetization pinned layer 15 according to the direction and strength of the external magnetic field, and the spin dependent scattering of the conductive electrons changes according to the relative angle. Therefore, a magnetoresistive change is generated. The MR element 4 detects this magnetoresistive change and reads the magnetic information of the recording medium M.

The position of the magnetization free layer 17 and the outer and inner magnetization pinned layers 13 and 15 may be disposed vertically in reverse order with respect to the spacer layer 16. That is to say, the magnetization free layer 17 may be positioned closer to the substrate W than the outer and inner magnetization pinned layers 13 and 15. Specifically, the layers from the inner magnetization pinned layer 15 to the anti-ferromagnetic layer 12 are arranged between the protective layer 18 and the spacer layer 16 (arranged so that the inner magnetization pinned layer 15 is at the bottommost side and the anti-ferromagnetic layer 12 is at the top-most side), and the magnetization free layer 17 is arranged between the under layer 11 and the spacer layer 16.

In the present specification, in terms of the magnetization free layer 17 and the inner magnetization pinned layer 15, the layer positioned closer to the substrate W above which the MR element 4 is formed, i.e., beneath the spacer layer 16 as viewed in the lamination direction, is referred to as the first magnetic layer L1, and the layer positioned farther from the first magnetic layer L1 as viewed from the substrate W, i.e., above the spacer layer 16 as viewed in the lamination direction, is referred to as the second magnetic layer L2. In the layer configuration illustrated in Table 1, the inner magnetization pinned layer 15 is the first magnetic layer L1, and the magnetization free layer 17 is the second magnetic layer L2, and in the layer configuration with the reversed positional relation, the magnetization free layer 17 is the first magnetic layer L1, and the inner magnetization pinned layer 15 is the second magnetic layer L2.

The spacer layer 16 includes a main spacer layer 16b composed of gallium oxide as a primary component. The main spacer layer 16b may contain additives other than gallium oxide. The additives are, for example, metal oxides. Also, the mole fraction of gallium oxide in the main spacer layer 16b is preferably 50% or more. The composition of gallium oxide is expressed by the general formula GaOx where the range of x is $1.45 \leq x \leq 1.55$. The main spacer layer 16b is normally formed in an amorphous state. GaOx has a larger resistance value and also a larger resistance change compared to Cu used in a conventional spacer layer. Therefore, a larger MR ratio may be obtained compared to the conventional MR element in which Cu is used as the spacer layer.

The main spacer layer 16b may contain zinc oxide as a primary component. Also in this case, the main spacer layer 16b may contain additives other than zinc oxide. The additives are, for example, metal oxides. Also, the mole fraction of zinc oxide in the main spacer layer 16b is preferably 50% or more. Zinc oxide, as well as gallium oxide, has a large resistance value and also a large resistance change. Therefore, a larger MR ratio may be obtained compared to a conventional MR element in which Cu is used as a spacer layer.

Gallium oxide and zinc oxide are promising materials for realizing a high MR ratio. However, since they contain oxygen, when the first and second magnetic layers L1 and L2 are adjacent to the main spacer layer 16b, elements such as Fe, Co, Ni and the like contained in the first and second magnetic layers L1 and L2, and particularly Fe, have a tendency for oxidation. When these elements oxidize, there is a tendency for the MR ratio to fall.

Therefore, for the purpose of avoiding direct contact between the main spacer layer 16b and the first magnetic layer L1 to effectively prevent oxidation of the first magnetic layer L1, the spacer layer 16 includes a first nonmagnetic layer 16a composed of Cu. The first nonmagnetic layer 16a is positioned closer to the substrate above which the MR element 4 is formed than the main spacer layer 16b. The first nonmagnetic layer 16a may contain a small amount of additives and may be partially oxidized. Namely, the first nonmagnetic layer 16a may be substantially composed of Cu and O. The first nonmagnetic layer 16a is positioned between the main spacer layer 16b and the first magnetic layer L1 in contact with both.

From the same reason, for the purpose of avoiding direct contact between the main spacer layer 16b and the second magnetic layer L2 to effectively prevent oxidation of the second magnetic layer L2, the spacer layer 16 includes a second nonmagnetic layer 16c composed of Cu or Zn. The second nonmagnetic layer is positioned farther from the substrate than the main spacer layer 16b. Cu layer or Zn layer forming the second nonmagnetic layer 16c may be partially oxidized.

The main spacer layer 16b may contain magnesium oxide as a primary component. In this case, since the main spacer layer 16b generates a tunneling magneto resistive (TMR) effect, the MR element 4 performs as a TMR element. Table 2 illustrates a specific layer configuration. When magnesium oxide is used, the first nonmagnetic layer 16a and the second nonmagnetic layer 16c are unnecessary. Namely, the spacer layer 16 can be configured only with the main spacer layer 16b. Also, it is preferred that the magnetization free layer 17 (the second magnetic layer L2) and the inner magnetization pinned layer 15 (the first magnetic layer L1) are composed of CoFeB.

TABLE 2

| Layer Configuration | | Material | Film Thickness (nm) |
|---|---|---|---|
| Upper Shield Layer 6 | | NiFe | 2000 |
| Stack 7 | Protective Layer 18 | Ru | 2.0 |
| | Magnetization Free Layer 17 (Second Magnetic Layer L2) | CoFeB | 3.0 |
| | Spacer Layer 16    Main Spacer Layer 16b | MgO | 0.9 |
| | Inner Magnetization Pinned Layer 15 (First Magnetic Layer L1) | CoFeB | 3.0 |
| | Exchange Coupling Transmitting Layer 14 | Ru | 0.8 |
| | Outer Magnetization Pinned Layer 13 | CoFe | 3.0 |
| | Anti-Ferromagnetic Layer 12 | IrMn | 5.0 |
| | Under Layer 11 | NiCr | 4.0 |
| Lower Shield Layer 5 | | NiFe | 2000 |

The MR element 4 further includes a cover layer 20a that covers the side surfaces 7a of the stack 7 with the exception of the air bearing surface. The cover layer 20a is composed of gallium oxide as a primary component. The cover layer 20a is covered by the insulating layer 20b composed of $Al_2O_3$, $SiO_2$ and the like. It is desired that the cover layer 20a completely covers the side surfaces 7a of the stack 7 with the exception of the air bearing surface S; however, the cover layer 20a may also cover partially. In that case, the portion that is not covered by the cover layer 20a is directly covered by the insulating layer 20b. The cover layer 20a may contain additives excluding gallium oxide. The additives are, for example, metal oxides. Also, the mole fraction of gallium oxide in the cover layer 20a is preferably 50% or more. The composition of gallium oxide is expressed by the general formula GaOx where the range of x is $1.45 \leq x \leq 1.55$.

By covering the stack 7 with the cover layer 20a composed of gallium oxide as a primary component, the MR ratio is improved.

A film thickness of the cover layer 20a is, for example, 1.5 nm or more and 10 nm or less.

Referencing FIG. 1 again, the recording head 3 is disposed above the reproducing head 2 with an interelement shield layer 8 formed therebetween by the sputtering method or the like. The recording head 3 has a configuration for so-called perpendicular magnetic recording. The magnetic pole layer for writing is composed of a main magnetic pole layer 21 and an auxiliary magnetic pole layer 22. These magnetic pole layers are formed by a frame plating method or the like. The main magnetic pole layer 21 is formed from FeCo and is arranged on the air bearing surface S in an orientation nearly orthogonal to the air bearing surface S. A coil layer 23 extending over a gap layer 24 composed of an insulating material is wound around the periphery of the main magnetic pole layer 21 so that a magnetic flux is induced to the main magnetic pole layer 21 by the coil layer 23. The coil layer 23 is formed by a frame plating method or the like. The magnetic flux is guided within the main magnetic pole layer 21 and is emitted from the air bearing surface S towards the recording medium M. The main magnetic pole layer 21 is tapered not only in the film surface orthogonal direction P but also in the track width direction T near the air bearing surface S to generate a minute and strong write magnetic field in accordance with the high recording density.

The auxiliary magnetic pole layer 22 is a magnetic layer magnetically coupled with the main magnetic pole layer 21. The auxiliary magnetic pole layer 22 is a magnetic pole layer with a film thickness between approximately 0.01 µm and approximately 0.5 µm and is formed of an alloy or the like composed of two or three of any of Ni, Fe, or Co. The auxiliary magnetic pole layer 22 is disposed in a manner that branches from the main magnetic pole layer 21 and faces the main magnetic pole layer 21 with the gap layer 24 and a coil insulating layer 25 therebetween on the air bearing surface S side. The end part of the auxiliary magnetic pole layer 22 on the air bearing surface S side forms the trailing shield part in which the layer cross-section is wider than other parts of the auxiliary magnetic pole layer 22. The magnetic field gradient between the auxiliary magnetic pole layer 22 and the main magnetic pole layer 21 becomes steeper in the vicinity of the air bearing surface S by providing this type of auxiliary magnetic pole layer 22. As a result, the signal output jitter is reduced, and the error rate during reading can be lowered.

An insulating layer 31 is formed in a portion that is other than the elements described above.

Second Embodiment

Figure 3A:
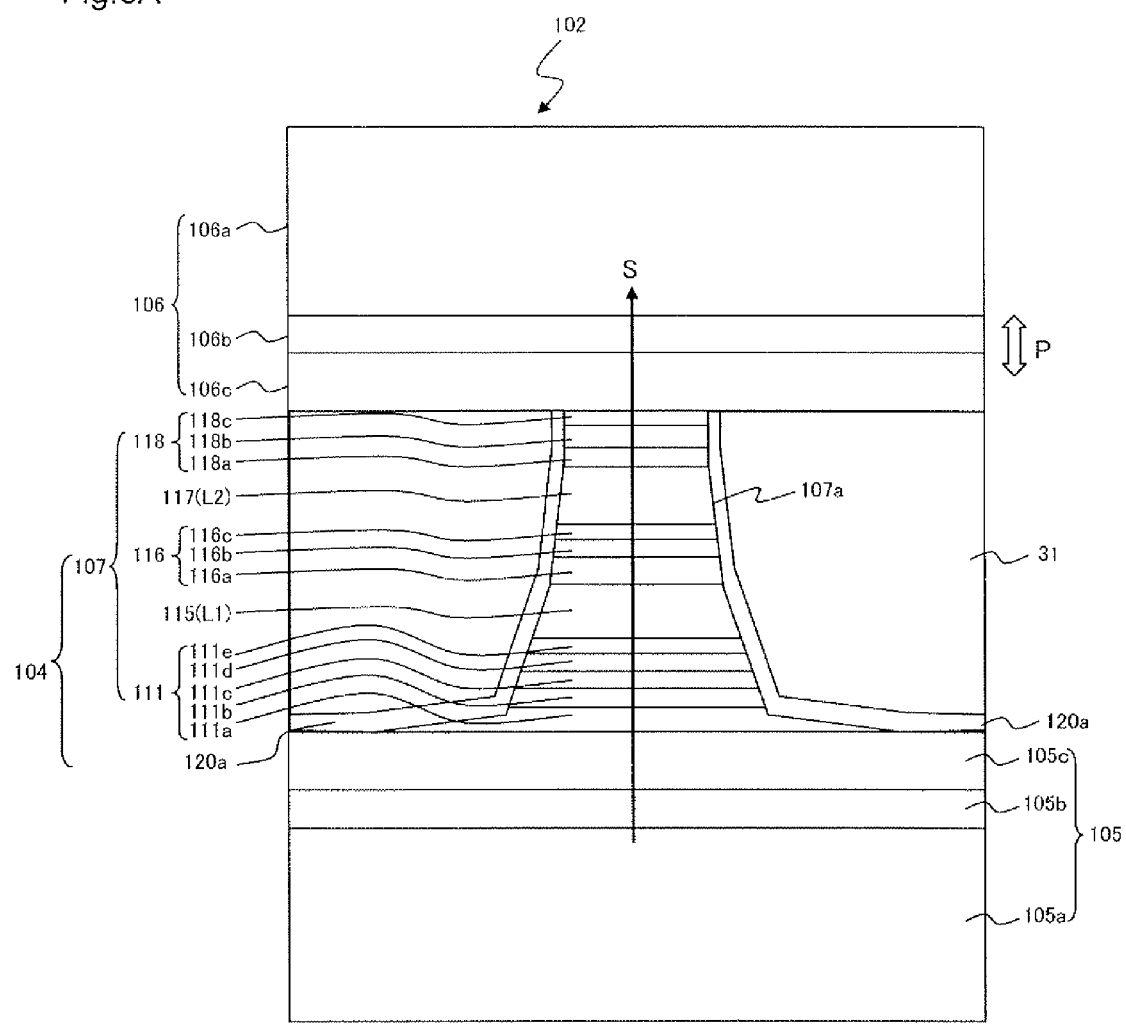
FIG. 3A is a side view of an MR element that relates to a second embodiment, as viewed from the A-A direction of FIG. 1, i.e., the air bearing surface.
Figure 3B:
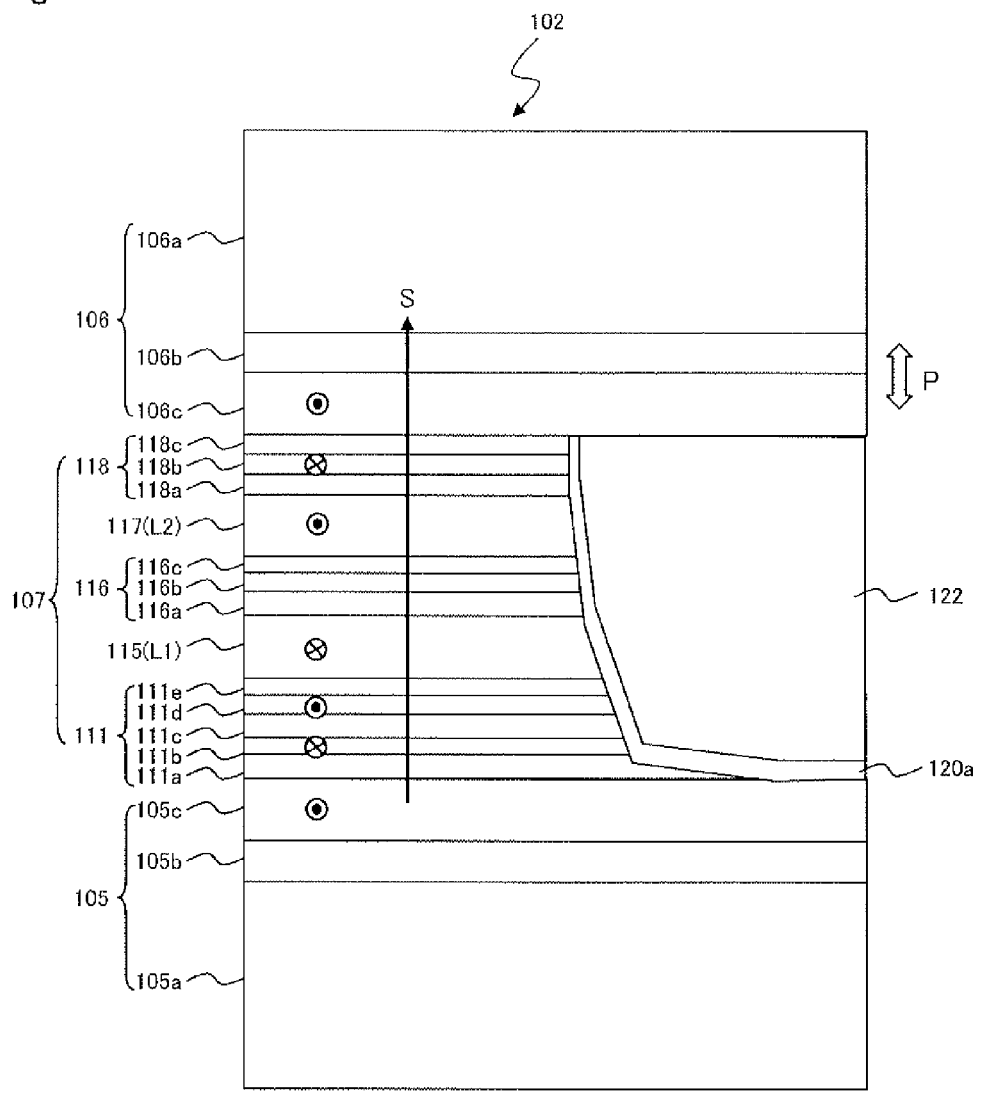
FIG. 3B is a side view of the MR element that relates to the second embodiment, as viewed from the same direction as FIG. 1.

A thin film magnetic head 1 of the present embodiment is the same as the first embodiment indicated in FIG. 1 with the exception of the configuration of the reproducing head 2. FIGS. 3A and 3B and Table 3 illustrate the layer configuration of a stack 107 of such an MR element 104. A reproducing head 102 includes an MR element 104 in which a large number of layers are laminated in the same manner as in the first embodiment, and upper and lower shield layers 106 and 105 that are disposed so as to sandwich the MR element 104 in the film surface orthogonal direction P (lamination direction). The upper and lower shield layers 106 and 105 are also used as electrodes for a sense current S to cause the sense current S to flow in the film surface orthogonal direction P of the MR element 104.

With the present embodiment, a first magnetic layer L1 and a second magnetic layer L2 are magnetization free layers 115 and 117 in both of which the magnetization direction changes according to the external magnetic field. A bias magnetic field application layer 122 is disposed on the backside of the MR element 104 as viewed from the air bearing surface S with a cover layer 120a, which will be described later, therebetween and applies a bias magnetic field to the first and second magnetization free layers 115 and 117 (first and second magnetic layers L1 and L2) in a direction orthogonal to the air bearing surface S. A spacer layer 116 is disposed between the first and second magnetization free layers 115 and 117. A first magnetic linkage layer 111 is disposed between the first magnetization free layer 115 and the lower shield layer 105, and a second magnetic linkage layer 118 is disposed between the second magnetization free layer 117 and the upper shield layer 106. A configuration of the spacer layer 116 is the same as the spacer layer 16 of the first embodiment, and the detail is described in the first embodiment. In the present embodiment, the spacer layer 116 is configured with a first nonmagnetic layer 116a composed of Cu, a main spacer layer 116b containing gallium oxide or zinc oxide as a primary component and a second nonmagnetic layer 116c composed of Zn or Cu.

TABLE 3

| | Film Configuration | | Material | Film Thickness (nm) |
|---|---|---|---|---|
| Upper Shield Layer 106 | Second Main Shield Layer 106a | | NiFe | 2000 |
| | Second Anti-Ferromagnetic Layer 106b | | IrMn | 6 |
| | Second Exchange Coupling Magnetic Field Application Layer 106c | | CoFe | 1.5 |
| | | | NiFe | 20 |
| Stack 107 | Second Magnetic Linkage Layer 118 | Exchange Coupling Transmitting Layer 118c | Ru | 0.8 |
| | | Gap Adjustment Layer 118b | CoFe | 1.0 |
| | | Exchange Coupling Transmitting Layer 118a | Ru | 0.8 |
| | Second Magnetization Free Layer 117 (Second Magnetic Layer L2) | | CoFe | 3.0 |
| | Spacer Layer 116 | Second Nonmagnetic Layer 116c | Zn (or Cu) | 0.4 |
| | | Main Spacer Layer 116b | GaOx or ZnO | GaOx 0.8 ZnO 1.6 |
| | | First Nonmagnetic Layer 116a | Cu | 0.6 |
| | First Magnetization Free Layer 115 (First Magnetic Layer L1) | | CoFe | 3.0 |
| | First Magnetic Linkage Layer 111 | Exchange Coupling Transmitting Layer 111e | Ru | 0.8 |
| | | Gap Adjustment Layer 111d | CoFe | 1.0 |
| | | Exchange Coupling Transmitting Layer 111c | Ru | 0.8 |
| | | Gap Adjustment Layer 111b | CoFe | 1.0 |

TABLE 3-continued

|  | Film Configuration | Material | Film Thickness (nm) |
|---|---|---|---|
|  | Exchange Coupling Transmitting Layer 111a | Ru | 0.8 |
| Lower Shield Layer 105 | First Exchange Coupling Magnetic Field Application Layer 105c | NiFe CoFe | 20 1.5 |
|  | First Anti-Ferromagnetic Layer 105b | IrMn | 6.0 |
|  | First Main Shield Layer 105a | NiFe | 2000 |

The lower shield layer 105 includes a first main shield layer 105a, and a first anti-ferromagnetic layer 105b and a first exchange coupling magnetic field application layer 105c laminated above the first main shield layer 105a. The magnetization direction of the first exchange coupling magnetic field application layer 105c is pinned in the track width direction T due to anti-ferromagnetic coupling with the first anti-ferromagnetic layer 105b. Similarly, the upper shield layer 106 includes a second main shield layer 106a, and a second anti-ferromagnetic layer 106b and a second exchange coupling magnetic field application layer 106c laminated below the second main shield layer 106a. The magnetization direction of the second exchange coupling magnetic field application layer 106c is pinned in the track width direction T due to anti-ferromagnetic coupling with the second anti-ferromagnetic layer 106b. The first and second exchange coupling magnetic field application layers 105c and 106c are magnetized mutually in the same direction. In other embodiments, instead of disposing the first and second anti-ferromagnetic layers 105b and 106b and the first and second exchange coupling magnetic field application layers 105c and 106c, the magnetization directions of the first and second main shield layers 105a and 106a may be oriented in the same direction by being formed in a long and narrow shape in the track width direction T and forming a single magnetic domain using a shape anisotropic effect.

The first magnetic linkage layer 111 has a structure in which gap adjustment layers 111b and 111d composed of CoFe are alternated and respectively laminated with exchange coupling transmitting layers 111a, 111c and 111e composed of Ru, and the exchange coupling transmitting layers 111a and 111e are positioned at both side end surfaces. The second magnetic linkage layer 118, in the same manner as the first magnetic linkage layer 111, also has a structure in which a gap adjustment layer 118b composed of CoFe is alternated and laminated with exchange coupling transmitting layers 118a and 118c composed of Ru, and the exchange coupling transmitting layers 118a and 118c are positioned at both side end surfaces. A pair of magnetic layers 105c and 111b, a pair of magnetic layers 111b and 111d, and a pair of magnetic layers 111d and 115 that respectively sandwich the exchange coupling transmitting layers 111a, 111c, and 111e perform exchange coupling. A pair of magnetic layers 106c and 118b and a pair of magnetic layers 118b and 117 that respectively sandwich the exchange coupling transmitting layers 118a and 118c perform exchange coupling. As illustrated in FIG. 3B, the magnetization directions alternately reverse (no bias magnetic field is applied).

The total film thickness of the MR element 104 can be adjusted to match the shield gap by adjusting the film thickness of the gap adjustment layers 111b, 111d and 118b. The smaller the shield gap is, the more beneficial it is to realize high recording density; however, the shield gap may also be determined according to the required film thickness of the bias magnetic field application layer 122. In this case, it is preferred to adjust the total film thickness, i.e., the shield gap, of the MR element 104 by changing the film thickness of the gap adjustment layers 111b, 111d and 118b.

The MR element 104 of the present embodiment includes, as in the first embodiment, the cover layer 120a that covers the side surfaces 107a of the stack 107 with the exception of the air bearing surface S. The cover layer 120a is composed of gallium oxide as a primary component, and the specific composition, formation portion and film thickness are all the same as the first embodiment. Also in the present embodiment, the MR ratio is improved by covering the stack 107 with the cover layer 120a composed of gallium oxide as a primary component. In the present embodiment, an insulating layer such as the insulating layer 20b of the first embodiment is not disposed; however, as in the first embodiment, the cover layer 120a may be covered by an insulating layer composed of $Al_2O_3$, $SiO_2$ or the like.

Figure 4:
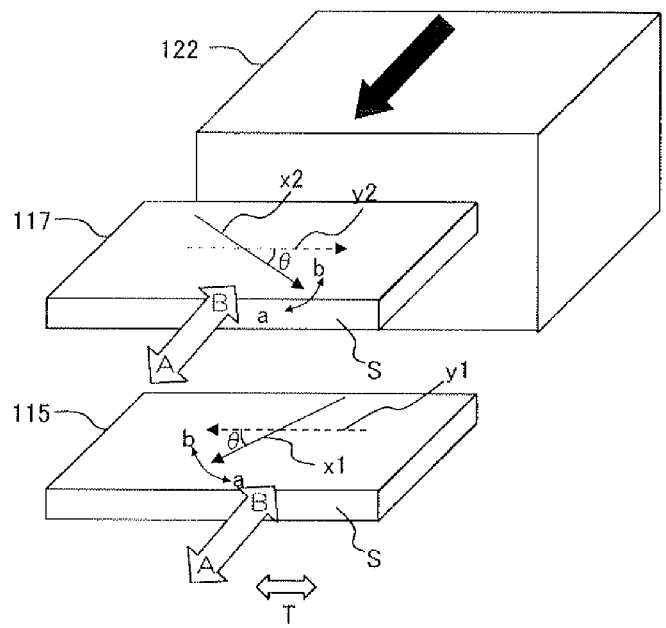
FIG. 4 is a schematic view illustrating a principle of performance of a thin film magnetic head that relates to the second embodiment.

The above-described MR element 104 performs as will be described hereinafter. A virtual condition will be considered first in which there is no bias magnetic field application layer 122. FIG. 4 is a schematic view illustrating the magnetizations of the first and second magnetization free layers 115 and 117. The magnetization directions of the first and second exchange coupling magnetic field application layers 105c and 106c transmit to the first and second magnetization free layers 115 and 117 while reversed by the gap adjustment layers 111b, 111d and 118b with the exchange coupling transmitting layers 111a, 111c, 111e, 118a and 118c therebetween. Therefore, the first magnetization free layer 115 is magnetized in the track width direction T toward an orientation y1 that is anti-parallel to the magnetization direction of the first exchange coupling magnetic field application layer 105c. The second magnetization free layer 117 is magnetized in the track width direction T toward an orientation y2 that is the same as the magnetization direction of the second exchange coupling magnetic field application layer 106c.

Next, a condition will be considered in which a bias magnetic field is applied. The bias magnetic field rotates the magnetization directions of the first and second magnetization free layers 115 and 117 oriented in the track width direction T toward a direction that is orthogonal to the air bearing surface S. As illustrated by the solid line arrows x1 and x2 in FIG. 4, the magnetization directions rotate only by the prescribed angle θ in mutually opposite directions from the broken line arrows y1 and y2, and ideally are mutually orthogonal. This is the magnetization state of the first and second magnetization free layers 115 and 117 when no external magnetic field is applied.

When an external magnetic field is applied in this state as illustrated by the outline arrows in the drawing, the magnetization directions of the first and second magnetization free layers 115 and 117 rotate in mutually opposite directions according to the orientation of the external magnetic field.

When the external magnetic field is applied in direction A in the drawing, the magnetization directions (solid line arrows x1 and x2) of the first and second magnetization free layers 115 and 117 rotate in direction (a) in the drawing, and when the external magnetic field is applied in direction B in the drawing, the magnetization directions of the first and second magnetization free layers 115 and 117 rotate in direction (b) in the drawing. In this manner, a relative angle formed by magnetization directions of the first and second magnetization free layers 115 and 117 changes according to the external magnetic field, and the resistance value for the sense current S varies based on the magnetoresistive effect. Utilizing this principle, the MR element 104 can detect the orientation and strength of the external magnetic field.

In this manner, the MR element 104 of the present embodiment includes a pair of magnetization free layers 115 and 117

The magnetization directions of the first and second magnetization free layers 115 and 117 can be reversed by adjusting the total number of Ru layers and gap adjustment layers included in the first and second magnetic linkage layers 111 and 118. For example, when the magnetization directions of the upper shield layer 106 and the lower shield layer 105 are anti-parallel, as illustrated in Table 4, the magnetization direction of the first magnetization free layer 115 can be reversed by configuring the first magnetic linkage layer 111 with two Ru layers 111a and 111c, and a single gap adjustment layer 111b inserted therebetween. In the same manner, a similar effect can be obtained with the configuration indicated in Table 3, although not illustrated in the drawing, by configuring the second magnetic linkage layer 118 with a five layer configuration that is similar to the first magnetic linkage layer 111.

TABLE 4

| | Film Configuration | | Material | Film Thickness (nm) |
|---|---|---|---|---|
| Upper Shield Layer 106 | Second Main Shield Layer 106a | | NiFe | 2000 |
| | Second Anti-Ferromagnetic Layer 106b | | IrMn | 6 |
| | Second Exchange Coupling Magnetic Field Application Layer 106c | | CoFe | 1.5 |
| | | | NiFe | 20 |
| Stack 107 | Second Magnetic Linkage Layer 118 | Exchange Coupling Transmitting Layer 118c | Ru | 0.8 |
| | | Gap Adjustment Layer 118b | CoFe | 1.0 |
| | | Exchange Coupling Transmitting Layer 118a | Ru | 0.8 |
| | Second Magnetization Free Layer 117 (Second Magnetic Layer L2) | | CoFe | 3.0 |
| | Spacer Layer 116 | Second Nonmagnetic Layer 116c | Zn (or Cu) | 0.4 |
| | | Main Spacer Layer 116b | GaOx or ZnO | GaOx 0.8 ZnO 1.6 |
| | | First Nonmagnetic Layer 116a | Cu | 0.6 |
| | First Magnetization Free Layer 115 (First Magnetic Layer L1) | | CoFe | 3.0 |
| | First Magnetic Linkage Layer 111 | Exchange Coupling Transmitting Layer 111c | Ru | 0.8 |
| | | Gap Adjustment Layer 111b | CoFe | 1.0 |
| | | Exchange Coupling Transmitting Layer 111a | Ru | 0.8 |
| Lower Shield Layer 105 | First Exchange Coupling Magnetic Field Application Layer 105c | | NiFe | 20 |
| | | | CoFe | 1.5 |
| | First Anti-Ferromagnetic Layer 105b | | IrMn | 6.0 |
| | First Main Shield Layer 105a | | NiFe | 2000 | in which the magnetization direction changes according to the external magnetic field, and the spacer layer 116 sandwiched by the magnetization free layers 115 and 117. The MR element 104 differs from the first embodiment with regards to the point that both magnetization directions of the pair of magnetization free layers 115 and 117 rotate according to the external magnetic field; however, the same configuration is used for the spacer layer 116 as the spacer layer 16 in the first embodiment.

As in the first embodiment, the main spacer layer may be also composed of magnesium oxide as a primary component. Table 5 illustrates the layer configuration of the stack 107. As in the first embodiment, the first nonmagnetic layer 116a and the second nonmagnetic layer 116c are unnecessary when magnesium oxide is used. Also, the magnetization free layer 117 (the second magnetic layer L2) and the inner magnetization pinned layer 115 (the first magnetic layer L1) are preferably formed of CoFeB.

TABLE 5

| | Film Configuration | Material | Film Thickness (nm) |
|---|---|---|---|
| Upper Shield Layer 106 | Second Main Shield Layer 106a | NiFe | 2000 |
| | Second Anti-Ferromagnetic Layer 106b | IrMn | 6 |
| | Second Exchange Coupling Magnetic Field Application Layer 106c | CoFe | 1.5 |
| | | NiFe | 20 |

TABLE 5-continued

| | Film Configuration | | Material | Film Thickness (nm) |
|---|---|---|---|---|
| Stack 107 | Second Magnetic Linkage Layer 118 | Exchange Coupling Transmitting Layer 118c | Ru | 0.8 |
| | | Gap Adjustment Layer 118b | CoFe | 1.0 |
| | | Exchange Coupling Transmitting Layer 118a | Ru | 0.8 |
| | Second Magnetization Free Layer 117 (Second Magnetic Layer L2) | | CoFeB | 3.0 |
| | Spacer Layer 116 | Main Spacer Layer 116b | MgO | 0.9 |
| | First Magnetization Free Layer 115 (First Magnetic Layer L1) | | CoFeB | 3.0 |
| | First Magnetic Linkage Layer 111 | Exchange Coupling Transmitting Layer 111e | Ru | 0.8 |
| | | Gap Adjustment Layer 111d | CoFe | 1.0 |
| | | Exchange Coupling Transmitting Layer 111c | Ru | 0.8 |
| | | Gap Adjustment Layer 111b | CoFe | 1.0 |
| | | Exchange Coupling Transmitting Layer 111a | Ru | 0.8 |
| Lower Shield Layer 105 | First Exchange Coupling Magnetic Field Application Layer 105c | | NiFe | 20 |
| | | | CoFe | 1.5 |
| | First Anti-Ferromagnetic Layer 105b | | IrMn | 6.0 |
| | First Main Shield Layer 105a | | NiFe | 2000 |

Third Embodiment

When main spacer layers 16b and 116b are formed of gallium oxide as a primary component, cover layers 20a and 120a may also be formed of magnesium oxide as a primary component. Film configurations of stacks 7 and 107 are the same as the first and second embodiments. MR elements 4 and 104 of the present embodiment are obtained only by changing the configurations of the cover layers 20a and 120a. Magnesium oxide as a material of the cover layers 20a and 120a, as well as gallium oxide, has an effect to improve the MR ratio.

Method for Manufacturing MR Element

Figure 5A:
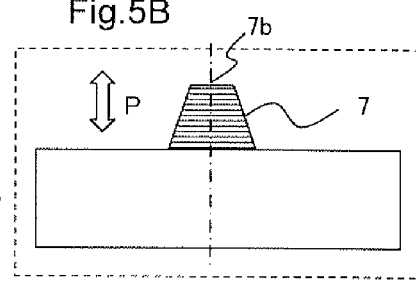
FIGS. 5A-5D are schematic views illustrating manufacturing processes of the MR element that relates to the first embodiment of the present invention.

Next, a description of a method for manufacturing the above-described MR element will be given using the MR element of the first embodiment as an example. First, as illustrated in FIG. 5A, the lower shield layer 5 is formed above the substrate by a plating method with the insulating layer therebetween as needed. Next, layers configuring the stack 7 are formed by sputtering. In the case of the configurations illustrated in Tables 1 and 2, a multilayer film 77 configured with layers from the under layer 11 through the protective layer 18 is formed by sputtering. Specifically, after depressurizing a film forming chamber C containing a target T and the substrate W to have a high vacuum atmosphere, inert gas such as argon is introduced into the film forming chamber C. When ionized inert gas collides with the target T, fine particles are ejected from the target T and are deposited on the lower shield layer 5. Gallium oxide is used for the target T when forming the main spacer layer 16b. At this time, the multilayer film 77 may have a width similar to the lower shield layer 5.

Figure 5B:
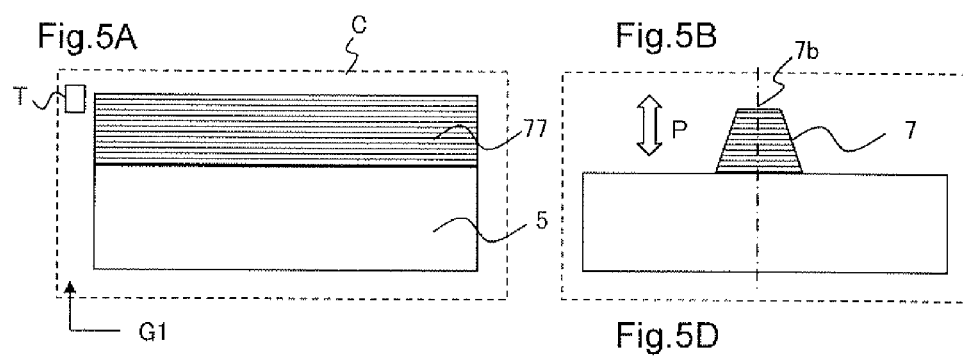

Next, as illustrated in FIG. 5B, the formed multilayer film 77 is shaped into the pillar stack 7. Specifically, a resist (not illustrated) is formed partially on the multilayer film 77, and the multilayer film 77 other than the portion covered by the resist is removed by sputter etching. The remaining multilayer film 77 is the pillar or trapezoidal stack 7. An axis direction 7b of the stack 7 corresponds to the lamination direction P of the multilayer film. After that, the resist is removed.

Figure 5C:
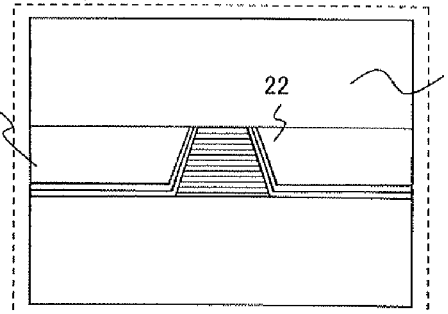

Next, as illustrated in FIG. 5C, the side surfaces 7a of the stack 7 are covered by the cover layer 20a composed of gallium oxide as a primary component. As well as forming the multilayer film 77, a sputtering method is used for forming the cover layer 20a. At this moment, inert gas, or inert gas and oxygen gas is/are introduced into the film forming chamber C. It is preferable to introduce inert gas and oxygen gas into the film forming chamber C. Normally, it is preferable that a ratio of the flow rate of oxygen gas with respect to the total flow rate of gas introduced when forming the cover layer is larger than a ratio of the flow rate of oxygen gas with respect to the total flow rate of gas introduced when forming the main spacer layer. At that time, the gas introduced when forming the main spacer layer may not contain oxygen gas.

Figure 5D:
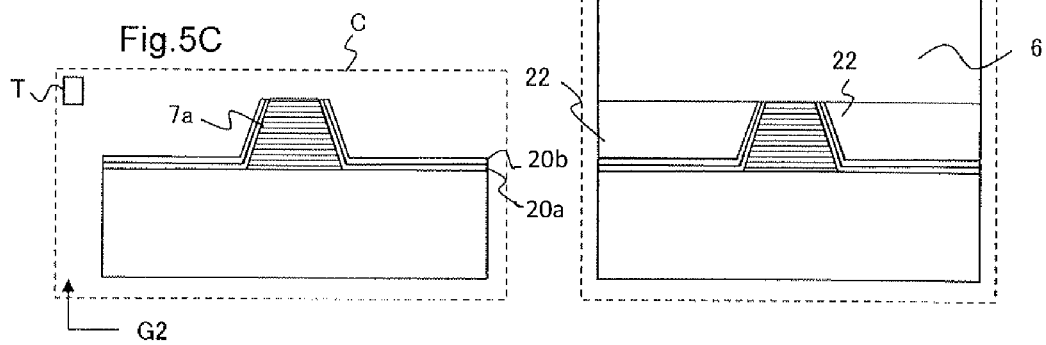

After that, the insulating layer 20b is formed on the cover layer 20a, the bias magnetic field application layers 22 are formed on both sides in the track width direction of the stack 7 as illustrated in FIG. 5D, and the upper shield layer 5 is formed on the stack 7 and the bias magnetic field application layers 22. In the case of the second embodiment, the bias magnetic field application layer 122 is formed on the backside of the stack 7 as viewed from the air bearing surface S.

Example

Regarding the example of the layer configuration illustrated in Table 3 or Table 5, an example in which gallium oxide was used for the cover layer 120a will be described. The main spacer layer was formed of gallium oxide, zinc oxide or magnesium oxide. After changing the pressure inside the chamber to a high vacuum of $1\times10^{-6}$ Pa or less, the multilayer film 77 was formed above the substrate W composed of $Al_2O_3$—TiC (ALTIC) by using a radio frequency (RF) sputtering or a direct current (DC) sputtering for each layer. The pressure inside the chamber while sputtering the layers was approximately 0.1 Pa, and heat treatment was performed at 250° C. for 3 hours after forming the multilayer film 77. Table 6 illustrates a film formation condition of the main spacer layer and the covering film. Note, flow rate indicates a flow rate (mL/min) at 0° C. at one atmosphere.

TABLE 6

| Portion | Sputtering Method | Gas Flow Rate Ar | Gas Flow Rate O | Target Application Power | Film Formation Rate |
|---|---|---|---|---|---|
| GaOx Main Spacer Layer | RF Sputtering | Ar 200 mL/min | 0 mL/min | 500 W | 0.003 nm/sec |
| ZnO Main Spacer Layer | DC Sputtering | Ar 200 mL/min | 0 mL/min | 200 W | 0.02 nm/sec |
| MgO Spacer Layer | RF Sputtering | Ar 200 mL/min | 0 mL/min | 500 W | 0.002 nm/sec |
| GaOx Cover layer (Without Oxygen Supply) | RF Sputtering | Ar 200 mL/min | 0 mL/min | 500 W | 0.003 nm/sec |
| GaOx Cover layer (With Oxygen Supply) | RF Sputtering | Ar 200 mL/min | 4 mL/min | 500 W | 0.003 nm/sec |
| MgO Cover layer (Without Oxygen Supply) | RF Sputtering | Ar 200 mL/min | 0 mL/min | 500 W | 0.002 nm/sec |
| MgO Cover layer (With Oxygen Supply) | RF Sputtering | Ar 200 mL/min | 4 mL/min | 500 W | 0.002 nm/sec |

Table 7 illustrates the MR ratio and the RA value (resistance-area value) when gallium oxide and zinc oxide were used for the main spacer layer, i.e., a CPP element was used. As comparison examples, examples in which $Al_2O_3$ was used for the cover layer 120a are illustrated.

while forming the cover layer 120a, the MR ratio further increased. Almost the same result was also obtained when magnesium oxide was used for the cover layer 120a.

Table 8 illustrates the MR ratio and the RA value when magnesium oxide was used for the main spacer layer, i.e., a

TABLE 7

| Sample No. | Main Spacer Layer Material Film Thickness Cu (nm) | Main Spacer Layer Material Film Thickness GaOx (nm) | Main Spacer Layer Material Film Thickness Zn (nm) | Cover layer Material | Cover layer Film Thickness (nm) | MR Ratio (%) | RA (Ωμ m²) | Oxygen Gas Supply During Cover layer Film Formation |
|---|---|---|---|---|---|---|---|---|
| Comparison Example 1 | 0.6 | 0.8 | 0.4 | $Al_2O_3$ | 5.0 | 18.5 | 0.21 | No |
| #1 | 0.6 | 0.8 | 0.4 | GaOx | 1.5 | 19.8 | 0.22 | No |
| #2 | 0.6 | 0.8 | 0.4 | GaOx | 5.0 | 20.7 | 0.22 | No |
| #3 | 0.6 | 0.8 | 0.4 | GaOx | 5.0 | 24.8 | 0.21 | Yes |
| | Cu (nm) | ZnO (nm) | Zn (nm) | | | | | |
| Comparison Example 2 | 0.6 | 1.6 | 0.4 | $Al_2O_3$ | 5.0 | 17.1 | 0.21 | No |
| #4 | 0.6 | 1.6 | 0.4 | GaOx | 5.0 | 20.7 | 0.21 | No |
| #5 | 0.6 | 1.6 | 0.4 | GaOx | 5.0 | 24.8 | 0.22 | Yes |
| | Cu (nm) | GaOx (nm) | Zn (nm) | | | | | |
| Comparison Example 3 | 0.6 | 0.8 | 0.4 | $Al_2O_3$ | 5.0 | 18.5 | 0.21 | No |
| #6 | 0.6 | 0.8 | 0.4 | MgO | 5.0 | 20.2 | 0.21 | No |
| #7 | 0.6 | 0.8 | 0.4 | MgO | 5.0 | 24.0 | 0.20 | Yes |

When gallium oxide was used for the cover layer 120a, the MR ratio increased compared to when $Al_2O_3$ was used, and RA value was almost the same. Also when the film thickness was small (1.5 nm), the higher MR ratio than the comparison examples was obtained. Moreover, by supplying oxygen gas TMR element was used. Compared to the case with the CPP configuration, the MR ratio is totally high and the RA value is totally large; however, the effects of the cover layer 120a composed of gallium oxide and the effect of supplying oxygen gas during film formation of the cover layer 120a were confirmed as well.

TABLE 8

| Sample No. | Spacer Layer Material Film Thickness MgO | Cover layer Material | Cover layer Material Film Thickness (nm) | MR Ratio (%) | RA (Ωμ m²) | Oxygen Gas Supply During Cover layer Film Formation |
|---|---|---|---|---|---|---|
| Comparison Example 4 | 0.9 | $Al_2O_3$ | 5.0 | 65.8 | 0.90 | No |

TABLE 8-continued

| Sample No. | Spacer Layer Material Film Thickness MgO | Cover layer Material | | MR Ratio (%) | RA (Ωμ m²) | Oxygen Gas Supply During Cover layer Film Formation |
| --- | --- | --- | --- | --- | --- | --- |
| | | Film | Thickness (nm) | | | |
| #8 | 0.9 | GaOx | 5.0 | 70.1 | 0.91 | No |
| #9 | 0.9 | GaOx | 5.0 | 76.2 | 0.91 | Yes |

(Magnetic Head Slider, Head Gimbal Assembly and Hard Disk Apparatus)

Figure 6:
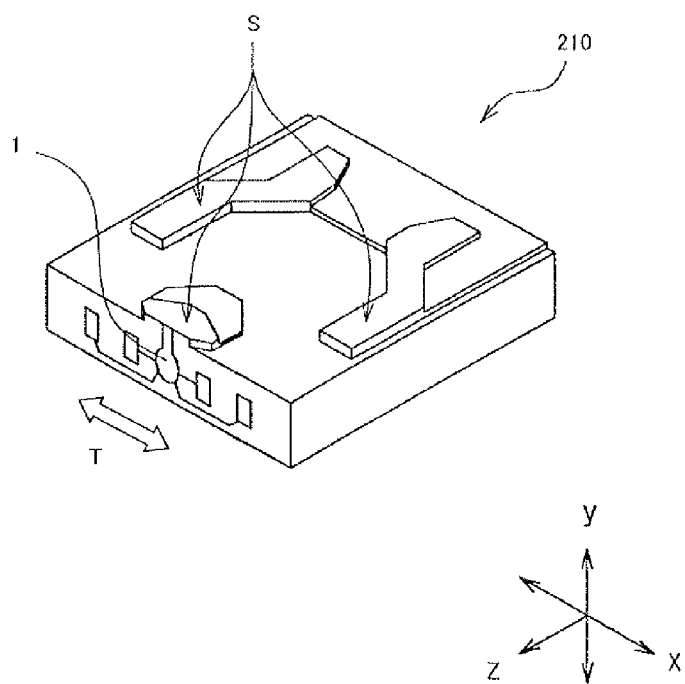
FIG. 6 is a perspective view of a magnetic head slider of the present invention.

Next, the description regarding a magnetic head slider on which the thin film magnetic head 1 is mounted will be given. Referring to FIG. 6, a magnetic head slider 210 has a substantially hexahedral shape, and one surface of the six outer surfaces is the air bearing surface S that faces a hard disk. The magnetic head slider 210 is arranged in the hard disk apparatus so as to face the hard disk, which is a disk-shaped recording medium M that is rotatably driven. When the hard disk rotates in the z-direction of FIG. 7, air flow passing between the hard disk and the magnetic head slider 210 generates a downward lifting force in the y-direction to the magnetic head slider 210. The magnetic head slider 210 flies above the surface of the hard disk due to the lifting force. In the vicinity of the edge part of the magnetic head slider 210 (edge part in the bottom left of FIG. 6) on the air flow exit side, the thin film magnetic head 1 is formed.

Figure 7:
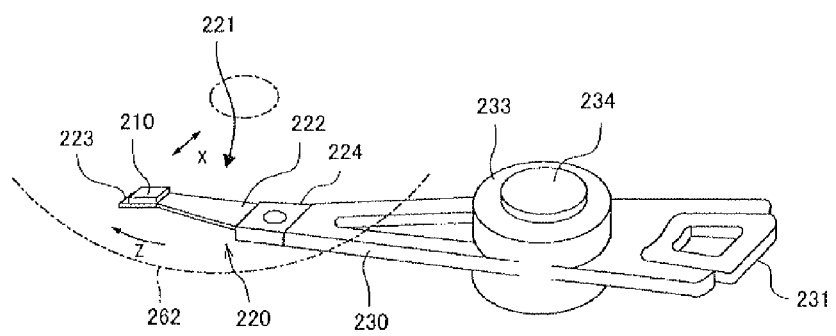
FIG. 7 is a perspective view of a head arm assembly of the present invention.

Referring to FIG. 7, a head gimbal assembly 220 includes the magnetic head slider 210 and a suspension 221 elastically supporting the magnetic head slider 210. The suspension 221 includes a load beam 222, a flexure 223 and a base plate 224. The load beam 222 is formed of stainless steel in a plate spring shape. The flexure 223 is arranged in one edge part of the load beam 222. The base plate 224 is arranged in the other edge part of the load beam 222. The magnetic head slider 210 is joined to the flexure 223 to give the magnetic head slider 210 suitable flexibility. At the part of the flexure 223 to which the magnetic head slider 210 is attached, a gimbal part is disposed to maintain the magnetic head slider 210 in an appropriate orientation.

An assembly in which the head gimbal assembly 220 is mounted to an arm 230 is referred to as a head arm assembly 221. The arm 230 moves the magnetic head slider 210 in a track crossing direction x of a hard disk 262. One edge of the arm 230 is attached to the base plate 224. To the other edge of the arm 230, a coil 231 that forms one part of a voice coil motor is attached. A bearing part 233 is disposed in the middle part of the arm 230. The arm 230 is rotatably supported by a shaft 234 attached to the bearing part 233. The arm 230 and the voice coil motor for driving the arm 230 form an actuator.

Figure 8:
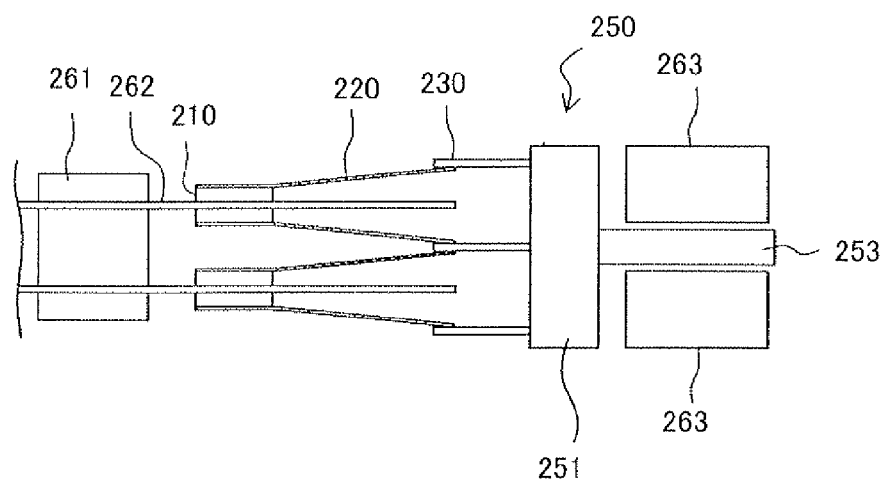
FIG. 8 is a side view of a head arm assembly of the present invention.
Figure 9:
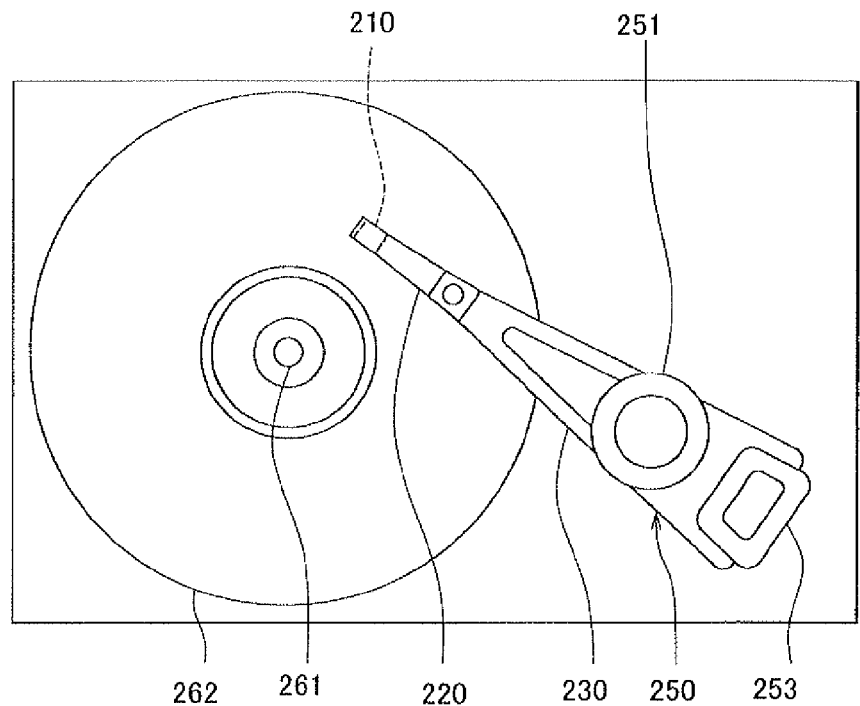
FIG. 9 is a plan view of a hard disk apparatus of the present invention.

Next, referring to FIGS. 8 and 9, the description will be given with regard to a head stack assembly in which the above-described magnetic head slider is integrated, and the hard disk apparatus. The head stack assembly is an assembly in which the head gimbal assembly 220 is attached to each arm of a carriage including a plurality of the arms. FIG. 8 is a side view of the head stack assembly. FIG. 9 is a plan view of the hard disk apparatus. The head stack assembly 250 includes a carriage 251 including a plurality of arms 230. On each of the arms 230, the head gimbal assembly 220 is attached so that the head gimbal assemblies 220 align mutually at an interval in the vertical direction. On the side of the carriage 251, which is the backside to the arm 230, a coil 253 is mounted to be a part of the voice coil motor. The voice coil motor includes permanent magnets 263 arranged so as to sandwich the coil 253 and to face each other.

Referring to FIG. 9, the head stack assembly 250 is integrated in the hard disk apparatus. The hard disk apparatus includes multiple hard disks 262 attached to a spindle motor 261. For each of the hard disks 262, two magnetic head sliders 210 are arranged in a manner of sandwiching the hard disk 262 and facing each other. The head stack assembly 250, except for the magnetic head slider 210 and the actuator, positions the magnetic head slider 210 with respect to the hard disk 262 in correspondence with a positioning device as well as supports the magnetic head slider 210. The magnetic head slider 210 is moved in the track crossing direction of the hard disk 262 by the actuator, and is positioned with respect to the hard disk 262. The thin film magnetic head 11 included in the magnetic head slider 210 records information to the hard disk 262 with the recording head 3, and reproduces information recorded on the hard disk 262 with the reproducing heads 2 and 102.

While preferred embodiments of the present invention have been shown and described in detail, and it is to be understood that variety of changes and modifications may be made without departing from the spirit of scope of the following claims or its scope.

What claimed is:

1. A magneto-resistive effect element (MR element), comprising:
   a stack, being a pillar or trapezoidal stack, including
      first and second magnetic layers in which a relative angle formed by magnetization directions changes according to an external magnetic field, and
      a spacer layer that is positioned between the first magnetic layer and the second magnetic layer, and that is provided with a main spacer layer that is composed of gallium oxide, zinc oxide or magnesium oxide as a primary component, wherein
   one part of side surfaces of the stack forms a part of an air bearing surface; and
   a cover layer that covers at least another part of the side surfaces of the stack and that is composed of gallium oxide as a primary component.

2. The MR element according to claim 1, wherein
   the main spacer layer and the cover layer are formed under the following conditions:
      introducing either inert gas or inert gas and oxygen gas into a film forming chamber when forming the main spacer layer;
      introducing inert gas and oxygen gas into the film forming chamber when forming the cover layer; and
      a ratio of flow rate of oxygen gas with respect to total flow rate of gas introduced when forming the cover layer being larger than a ratio of flow rate of oxygen gas with respect to total flow rate of gas introduced when forming the spacer layer.

3. A magneto-resistive effect element (MR element), comprising:
a stack, being a pillar or trapezoidal stack, including
first and second magnetic layers in which a relative angle formed by magnetization directions changes according to an external magnetic field, and
a spacer layer that is positioned between the first magnetic layer and the second magnetic layer, and that is provided with a main spacer layer that is composed of gallium oxide as a primary component, wherein
one part of side surfaces of the stack forms a part of an air bearing surface; and
a cover layer that covers at least another part of the side surfaces of the stack and that is composed of magnesium oxide as a primary component.

4. The MR element according to claim 3, wherein
the main spacer layer and the cover layer are formed under the following conditions:
introducing either inert gas or inert gas and oxygen gas into a film forming chamber when forming the main spacer layer;
introducing inert gas and oxygen gas into the film forming chamber when forming the cover layer;
a ratio of flow rate of oxygen gas with respect to total flow rate of gas introduced when forming the cover layer being larger than a ratio of flow rate of oxygen gas with respect to total flow rate of gas introduced when forming the spacer layer.

5. A magnetic head, comprising:
the MR element according to claim 1.

6. The magnetic head according to claim 5, wherein
one of the first magnetic layer and the second magnetic layer is a magnetization free layer in which a magnetization direction changes according to the external magnetic field and the other is a magnetization pinned layer in which a magnetization direction is pinned according to the external magnetic field,
the magnetic head further comprises a pair of bias magnetic field application layers that is disposed on both sides of the MR element in a track width direction and that applies a bias magnetic field in the track width direction to the magnetization free layer.

7. The magnetic head according to claim 5, wherein
both of the first magnetic layer and the second magnetic layer are magnetization free layers in which magnetization directions change according to the external magnetic field,
the magnetic head further comprises a bias magnetic field application layer that is disposed on a backside of the MR element as viewed from the air bearing surface and that applies a bias magnetic field in a direction orthogonal to the air bearing surface to the first and second magnetic layers.

8. A magnetic head, comprising:
the MR element according to claim 3.

9. The magnetic head according to claim 8, wherein
one of the first magnetic layer and the second magnetic layer is a magnetization free layer in which a magnetization direction changes according to the external magnetic field and the other is a magnetization pinned layer in which a magnetization direction is pinned according to the external magnetic field,
the magnetic head further comprises a pair of bias magnetic field application layers that is disposed on both sides of the MR element in a track width direction and that applies a bias magnetic field in the track width direction to the magnetization free layer.

10. The magnetic head according to claim 8, wherein
both of the first magnetic layer and the second magnetic layer are magnetization free layers in which magnetization directions change according to the external magnetic field,
the magnetic head further comprises a bias magnetic field application layer that is disposed on a backside of the MR element as viewed from the air bearing surface, and that applies a bias magnetic field in a direction orthogonal to the air bearing surface to the first and second magnetic layers.

11. A magnetic head slider, comprising:
the magnetic head according to claim 5.

12. A head gimbal assembly, comprising:
the magnetic head according to claim 5.

13. A hard disk drive apparatus, comprising:
the magnetic head according to claim 5.

14. A magnetic head slider, comprising:
the magnetic head according to claim 8.

15. A head gimbal assembly, comprising:
the magnetic head according to claim 8.

16. A hard disk drive apparatus, comprising:
the magnetic head according to claim 8.

17. A method for manufacturing a magneto-resistive effect element (MR element), comprising:
forming a multilayer film that includes first and second magnetic layers in which a relative angle formed by magnetization directions changes according to an external magnetic field and a spacer layer that is positioned between the first magnetic layer and the second magnetic layer and that is provided with a main spacer layer that is composed of gallium oxide, zinc oxide or magnesium oxide as a primary component;
forming the multilayer film in a pillar or trapezoidal stack; and
covering side surfaces of the stack with a cover layer composed of gallium oxide as a primary component.

18. The method for manufacturing the MR element according to claim 17, comprising:
introducing either inert gas or inert gas and oxygen gas into a film forming chamber when forming the main spacer layer;
introducing inert gas and oxygen gas into the film forming chamber when forming the cover layer, and
making a ratio of flow rate of oxygen gas with respect to total flow rate of gas introduced when forming the cover layer larger than a ratio of flow rate of oxygen gas with respect to total flow rate of gas introduced when forming the spacer layer.

19. A method for manufacturing a magneto-resistive effect element (MR element), comprising:
forming a multilayer film that includes first and second magnetic layers in which a relative angle formed by magnetization directions changes according to an external magnetic field and a spacer layer that is positioned between the first magnetic layer and the second magnetic layer and that is provided with a main spacer layer that is composed of gallium oxide as a primary component;
forming the multilayer film in a pillar or trapezoidal stack; and
covering side surfaces of the stack with a cover layer composed of magnesium oxide as a primary component.

20. The method for manufacturing the MR element according to claim 19, comprising:

introducing either inert gas or inert gas and oxygen gas into a film forming chamber when forming the main spacer layer;

introducing inert gas and oxygen gas into the film forming chamber when forming the cover layer, making a ratio of flow rate of oxygen gas with respect to total flow rate of gas introduced when forming the cover layer larger than a ratio of flow rate of oxygen gas with respect to total flow rate of gas introduced when forming the spacer layer.

* * * * *